United States Patent
Xue

(10) Patent No.: US 12,550,750 B2
(45) Date of Patent: Feb. 10, 2026

(54) SEMICONDUCTOR DEVICE AND FABRICATION METHOD THEREOF

(71) Applicant: CHANGXIN MEMORY TECHNOLOGIES, INC., Hefei (CN)

(72) Inventor: Dong Xue, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 390 days.

(21) Appl. No.: 18/327,063

(22) Filed: Jun. 1, 2023

(65) Prior Publication Data

US 2023/0307378 A1    Sep. 28, 2023

Related U.S. Application Data

(63) Continuation of application No. PCT/CN2022/126753, filed on Oct. 21, 2022.

(30) Foreign Application Priority Data

Jan. 7, 2022 (CN) .......................... 202210014858.8

(51) Int. Cl.
H01L 23/544 (2006.01)

(52) U.S. Cl.
CPC .. *H01L 23/544* (2013.01); *H01L 2223/54426* (2013.01)

(58) Field of Classification Search
CPC ......... H01L 23/544; H01L 2223/54426; H01L 2223/54453; H01L 21/311; H01L 21/768;

(Continued)

(56) References Cited

U.S. PATENT DOCUMENTS

2002/0048928 A1* 4/2002 Nakagawa .......... H01L 21/7682
257/E21.507
2008/0150146 A1 6/2008 Lee

FOREIGN PATENT DOCUMENTS

CN    106597818 A    4/2017
CN    112310134 A    2/2021
CN    112908966 A    6/2021

OTHER PUBLICATIONS

ISA State Intellectual Property Office of the People's Republic of China, International Search Report Issued in Application No. PCT/CN2022/126753, Dec. 22, 2022, WIPO, 10 pages.

* cited by examiner

Primary Examiner — Alexander G Ghyka
(74) Attorney, Agent, or Firm — Kilpatrick Townsend & Stockton LLP

(57) ABSTRACT

Embodiments provide a semiconductor device and a fabrication method. The fabrication method includes: providing a substrate including an alignment region and a connection region; forming a first conductive layer on the substrate; forming a spacer material layer group on the first conductive layer; forming a protective layer on the spacer material layer group, the protective layer being positioned on the alignment region; etching the spacer material layer group and the protective layer, an etching rate of the protective layer being less than an etching rate of the spacer material layer group to remove the spacer material layer group on the connection region to form a spacer layer group, and forming an alignment groove on the spacer layer group in the alignment region; and forming a second conductive layer group on the spacer layer group and the first conductive layer, the second conductive layer group covering the alignment groove.

14 Claims, 4 Drawing Sheets

(58) Field of Classification Search
CPC ... H01L 21/76802; G03F 9/708; G03F 9/7084
See application file for complete search history.

SEMICONDUCTOR DEVICE AND FABRICATION METHOD THEREOF

CROSS-REFERENCE TO RELATED APPLICATION

The present disclosure is a continuation of PCT/CN2022/126753, filed on Oct. 21, 2022, which claims priority to Chinese Patent Application No. 202210014858.8, titled "SEMICONDUCTOR DEVICE AND FABRICATION METHOD THEREOF" and filed on Jan. 7, 2022, the entire contents of which are incorporated herein by reference.

TECHNICAL FIELD

The present disclosure relates to the field of semiconductor technology, and more particularly, to a semiconductor device and a method for fabricating the semiconductor device.

BACKGROUND

Redistribution layer (RDL) of a semiconductor chip means to change an originally designed IC circuit contact position (I/O pad) by wafer-level metal wiring process and bumping process, such that the IC can be suitable for different package types.

However, in the process of existing RDL, due to limitations of technologies, an alignment groove formed has a larger depth, which leads to a larger depth-to-width ratio of the alignment groove, brings loud noises to alignment of lithography machines, and likely leads to the alignment failure of lithography machines.

It should be noted that information disclosed in the above background section is used merely for enhancement of understanding of the background of the present disclosure, and therefore may include information that does not constitute the prior art known to those of ordinary skill in the art.

SUMMARY

According to an aspect of the present disclosure, there is provided a method for fabricating a semiconductor structure, including: providing a substrate comprising an alignment region and a connection region; forming a first conductive layer on the substrate; forming an isolation material layer group on the first conductive layer; forming a protective layer on the isolation material layer group, the protective layer being positioned on the alignment region; etching the isolation material layer group and the protective layer, an etching rate of the protective layer being less than an etching rate of the isolation material layer group to remove the isolation material layer group on the connection region to form an isolation layer group, and forming an alignment groove on the isolation layer group in the alignment region, a depth of the alignment groove being less than a thickness of the isolation layer group; and forming a second conductive layer group on the isolation layer group and the first conductive layer, the second conductive layer group covering the alignment groove.

According to another aspect of the present disclosure, there is provided a semiconductor device, which includes: a substrate comprising an alignment region and a connection region; a first conductive layer arranged on the substrate; an isolation layer group arranged on the first conductive layer and positioned on the alignment region, where the isolation layer group is provided with an alignment groove, and a depth of the alignment groove is less than a thickness of the isolation layer group; and a second conductive layer group arranged on the isolation layer group and the first conductive layer, where the second conductive layer group covers the alignment groove.

It is to be understood that the above general description and the detailed description below are merely exemplary and explanatory, and do not limit the present disclosure.

BRIEF DESCRIPTION OF THE DRAWINGS

The accompanying drawings here are incorporated in and constitute a part of this specification, illustrate embodiments conforming to the present disclosure and, together with the specification, serve to explain the principles of the present disclosure. Apparently, the accompanying drawings in the following description show merely some embodiments of the present disclosure, and persons of ordinary skill in the art may still derive other drawings from these accompanying drawings without creative efforts.

Figure 1:
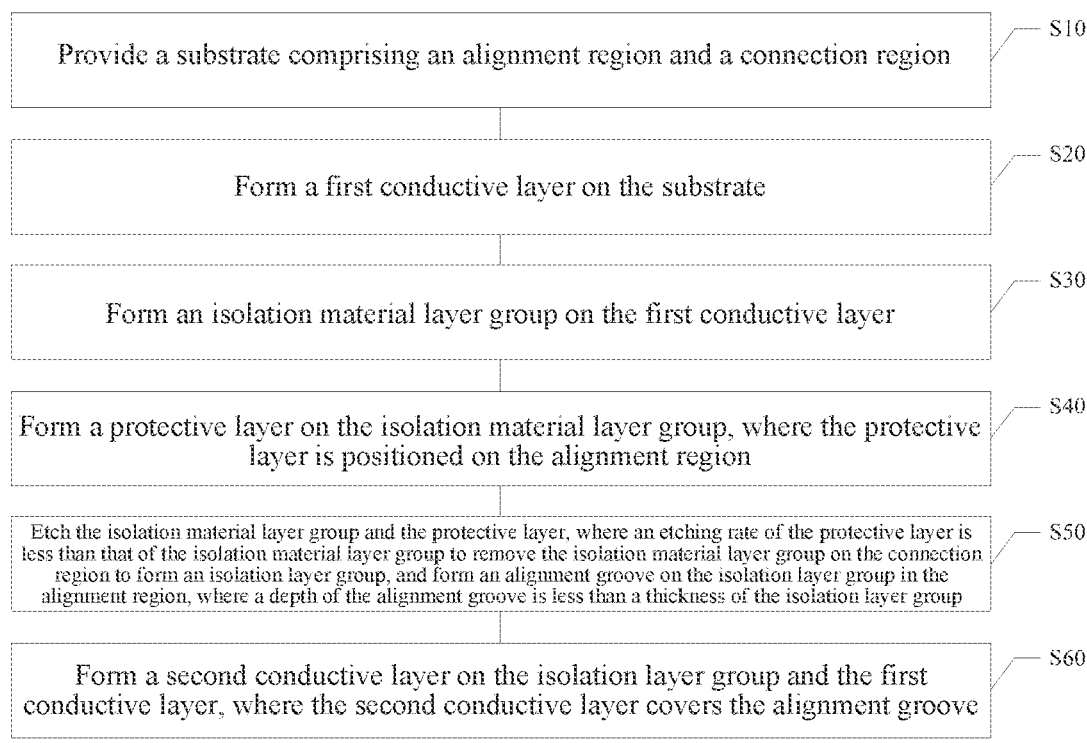
FIG. 1 is a schematic flow diagram of a method for fabricating a semiconductor device according to an exemplary embodiment of the present disclosure.

REFERENCE NUMERALS IN THE ACCOMPANYING DRAWINGS substrate 1; first conductive layer 2; isolation material layer group 3; first isolation material layer 31; second isolation material layer 32; third isolation material layer 33; isolation layer group 4; first isolation layer 41; second isolation layer 42; third isolation layer 43; protective layer 7; alignment groove 8; preset pattern 9; second conductive layer group 10; titanium metal layer 101; aluminum metal layer 102; titanium nitride layer 103; alignment region A; and connection region B.

DETAILED DESCRIPTION

Exemplary embodiments will now be described more comprehensively with reference to the accompanying drawings. However, the exemplary embodiments may be carried out in various manners, and shall not be interpreted as being limited to the embodiments set forth herein; instead, providing these embodiments will make the present disclosure more comprehensive and complete, and will fully convey the conception of the exemplary embodiments to those skilled in the art. Throughout the drawings, similar reference signs indicate the same or similar structures, and thus their detailed description will be omitted. In addition, the accompanying drawings are merely exemplary illustration of the present disclosure, and are not necessarily drawn to scale.

Although this specification employs relativity terms such as "above" and "below" to describe a relative relation between one component and another component of icons, these terms are merely for convenience of this specification, for example, the directions of the examples in the accompanying drawings. It is to be understood that when the apparatus of the icon are turned upside down, components described as "above" will become components described as "below". When a certain structure is "above" other structures, it likely means that the certain structure is integrally formed on the other structures, or the certain structure is "directly" arranged on the other structures, or the certain structure is "indirectly" arranged on the other structures by means of another structure.

The terms "one", "a", "said", "the" and "at least one" may be intended to indicate presence of one or more elements/constituent parts, etc. The terms "comprising" and "having" are inclusive and therefore specify the presence of other elements/constituent parts or the like in addition to the elements/constituent parts listed out. The terms "first", "second" and "third" or the like are merely for marker purposes, and do not impose numerical limitations on objects thereof.

Exemplary embodiments of the present disclosure provide a method for fabricating a semiconductor device. As shown in FIG. 1, the method for fabricating the semiconductor device may include following steps.

In Step S10, a substrate 1 is provided, which includes an alignment region A and a connection region B.

In Step S20, a first conductive layer 2 is formed on the substrate 1.

In Step S30, an isolation material layer group 3 is formed on the first conductive layer 2.

In Step S40, a protective layer 7 is formed on the isolation material layer group 3, and the protective layer 7 is positioned on the alignment region A.

In Step S50, the isolation material layer group 3 and the protective layer 7 are etched, an etching rate of the protective layer 7 is less than an etching rate of the isolation material layer group 3 to remove the isolation material layer group 3 on the connection region B to form an isolation layer group 4, and an alignment groove 8 is formed on the isolation layer group 4 in the alignment region, where a depth of the alignment groove 8 is less than a thickness of the isolation layer group 4.

In Step S60, a second conductive layer group 10 is formed on the isolation layer group 4 and the first conductive layer 2, and the second conductive layer group 10 covers the alignment groove 8.

According to the method for fabricating the semiconductor device provided by the present disclosure, the protective layer 7 is formed on the isolation material layer group 3, and the protective layer 7 is positioned on the alignment region A. When etching the isolation material layer group 3 and the protective layer 7, because the etching rate of the protective layer 7 is less than that of the isolation layer group 4, the alignment groove 8 may be formed on the isolation material layer group 3 of the alignment region A while removing the isolation material layer group 3 on the connection region B, and the depth of the alignment groove 8 is smaller than the thickness of the isolation material layer group 3. Therefore, the depth of the alignment groove 8 is smaller, and a depth-width ratio is smaller. When a lithography machine is aligning, laser light emitted by the lithography machine has less number of reflections in the alignment groove 8 after hitting the alignment groove 8, which may reduce errors of the laser light, thereby improving alignment accuracy of the laser light, enabling the lithography machine to align well through the alignment groove 8, and thus solving a problem of alignment failure of the lithography machine. Moreover, an inclined structure is not easily formed on a bottom of the alignment groove 8 with a smaller depth, which is also beneficial for the lithography machine to align through the alignment groove 8. When the depth-width ratio of the alignment groove 8 is greater, the laser light emitted by the lithography machine has greater number of reflections in the alignment groove 8 after hitting the alignment groove 8, and the accuracy of the laser light after multiple reflections may be reduced, which has a negative effect on alignment of the lithography machine and thus results in alignment failure.

The method for fabricating the semiconductor device is described in detail below.

In Step S10, a substrate 1 is provided, which includes the alignment region A and the connection region B.

In this exemplary embodiment, the substrate 1 may be a semiconductor element that has been fabricated, and the semiconductor element may be a Metal-Oxide-Semiconductor Field-Effect Transistor (MOSFET), which is abbreviated as a MOS transistor. The MOS transistor may be a Positive Channel Metal Oxide Semiconductor (PMOS) or a Negative Channel Metal Oxide Semiconductor (NMOS) transistor, and the MOS transistor may include a storage capacitor, a bit line, a word line, a gate, a source and a drain, etc.

Figure 2:
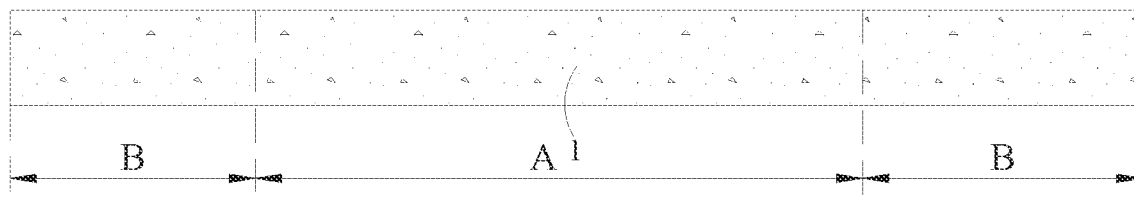
FIG. 2 is a schematic structural diagram of a substrate provided in the method for fabricating the semiconductor device according to the present disclosure.

Referring to FIG. 2, the substrate 1 may include the alignment region A and the connection region B. In some embodiments, two connection regions B may be provided, and the two connection regions B are positioned on two sides of the alignment region A.

Of course, in other exemplary embodiments of the present disclosure, a plurality of connection regions B may also be provided, and concrete positions of the plurality of connection regions B may be set as required; and a plurality of alignment regions A may also be provided, and concrete positions of the plurality of alignment regions A may also be set as required.

In Step S20, the first conductive layer 2 is formed on the substrate 1.

Figure 3:
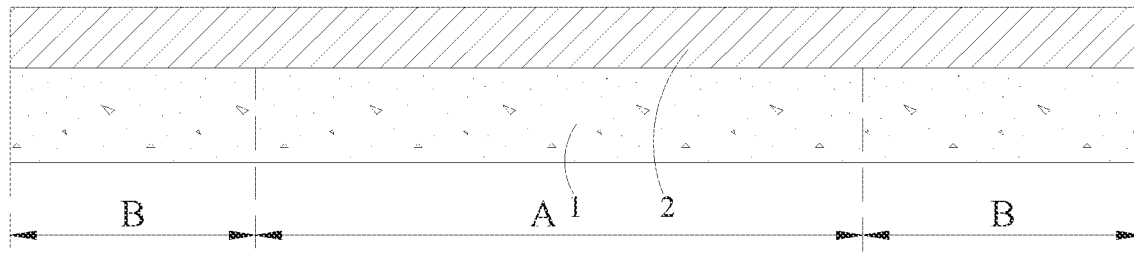
FIG. 3 is a schematic structural diagram after a first conductive layer is formed on the basis of FIG. 2.

In this exemplary embodiment, a first conductive material layer is formed on the substrate 1 by means of deposition, sputtering, evaporation or the like, and then the first conductive material layer is etched to form the patterned first conductive layer 2. Referring to FIG. 3, the first conductive layer 2 not only is formed in the alignment region A, but also is formed in the connection region B. The first conductive layer 2 may be connected to a gate, a source or a drain in the substrate 1, and signals can be inputted to the gate, the source or the drain in the substrate 1 through the first conductive layer 2, or the signals stored in the substrate 1 can be outputted through the first conductive layer 2. A material of the first conductive layer 2 is, for example, aluminum. The thickness of the first conductive layer 2 ranges between 0.6 μm and 1.0 μm, and may be, for example, 0.6 μm, 0.8 μm, or 1.0 μm.

Of course, in other exemplary embodiments of the present disclosure, the material of the first conductive layer 2 may include metal such as copper or silver.

In Step S30, the isolation material layer group 3 is formed on the first conductive layer 2.

Figure 4:
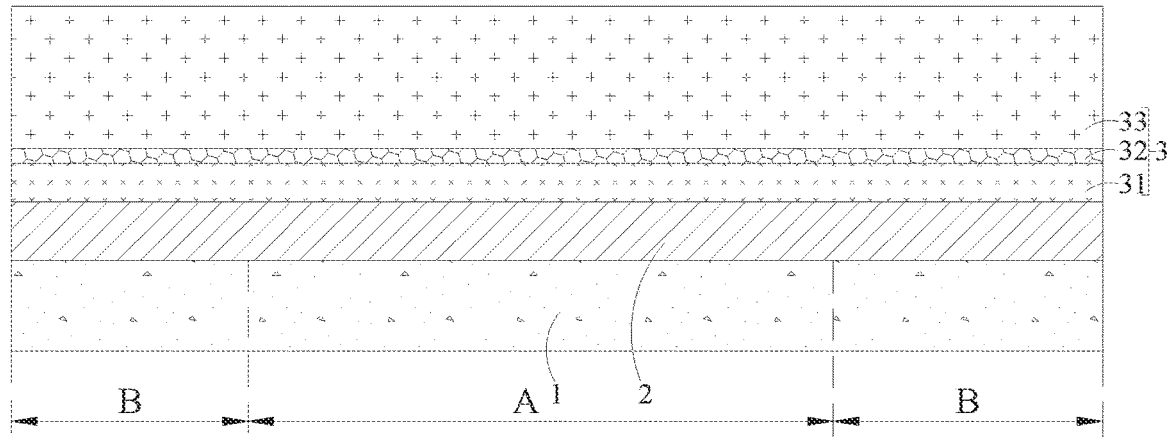
FIG. 4 is a schematic structural diagram after an isolation layer group is formed on the basis of FIG. 3.

In this exemplary embodiment, referring to FIG. 4, the first isolation material layer 31 is formed on the first conductive layer 2 by means of deposition, sputtering or evaporation, etc. The first isolation material layer 31 not only is formed in the alignment region A, but also is formed in the connection region B. That is, an orthographic projection of the first isolation material layer 31 on the substrate 1 is positioned within the alignment region A and the connection region B. The material of the first isolation material layer 31 includes, for example, silicon oxide. The thickness of the first isolation material layer 31 ranges, for example, between 0.6 μm and 1.0 μm. For example, the thickness of the first isolation material layer 31 may be 0.6 μm, 0.8 μm, or 1.0 μm.

A second isolation material layer 32 is formed on the first isolation material layer 31 by means of deposition, sputtering or evaporation, etc. The second isolation material layer 32 not only is formed in the alignment region A, but also is formed in the connection region B. That is, an orthographic projection of the second isolation material layer 32 on the substrate 1 is positioned within the alignment region A and the connection region B. A material of the second isolation material layer 32 includes, for example, silicon nitride. A thickness of the second isolation material layer 32 ranges, for example, between 0.5 μm and 0.7 μm. For example, the thickness of the second isolation material layer 32 may be 0.5 μm, or 0.6 μm, or 0.7 μm.

A third isolation material layer 33 is formed on the second isolation material layer 32 by means of deposition, sputtering or evaporation, etc. The third isolation material layer 33 not only is formed in the alignment region A, but also is formed in the connection region B. That is, an orthographic projection of the third isolation material layer 33 on the substrate 1 is positioned within the alignment region A and the connection region B. A material of the third isolation material layer 33 includes, for example, silicon oxide. A thickness of the third isolation material layer 33 is greater than that of the first isolation material layer 31. The thickness of the third isolation material layer 33 ranges, for example, between 4.0 μm and 5.0 μm. For example, the thickness of the third isolation material layer 33 may be 4.0 μm, 4.5 μm, or 5.0 μm.

The substrate 1 and the first conductive layer 2 may be protected by the isolation material layer group 3. Moreover, the thickness of the third isolation material layer 33 is larger, which can play a role of planarization, provide a better substrate for the second conductive layer group 10 formed subsequently, and facilitate forming the second conductive layer group 10 having a more uniform thickness, and thus it is advantageous to improving uniformity of conductivity of the semiconductor device. Furthermore, the larger thickness of the third isolation material layer 33 can prevent etching to the second isolation material layer 32 when the alignment groove 8 is formed, can protect the second isolation material layer 32 and prevent the alignment groove 8 from exposing the second isolation material layer 32, to improve performance of the semiconductor device.

In Step S40, the protective layer 7 is formed on the isolation material layer group 3, and the protective layer 7 is positioned on the alignment region A.

Figure 5:
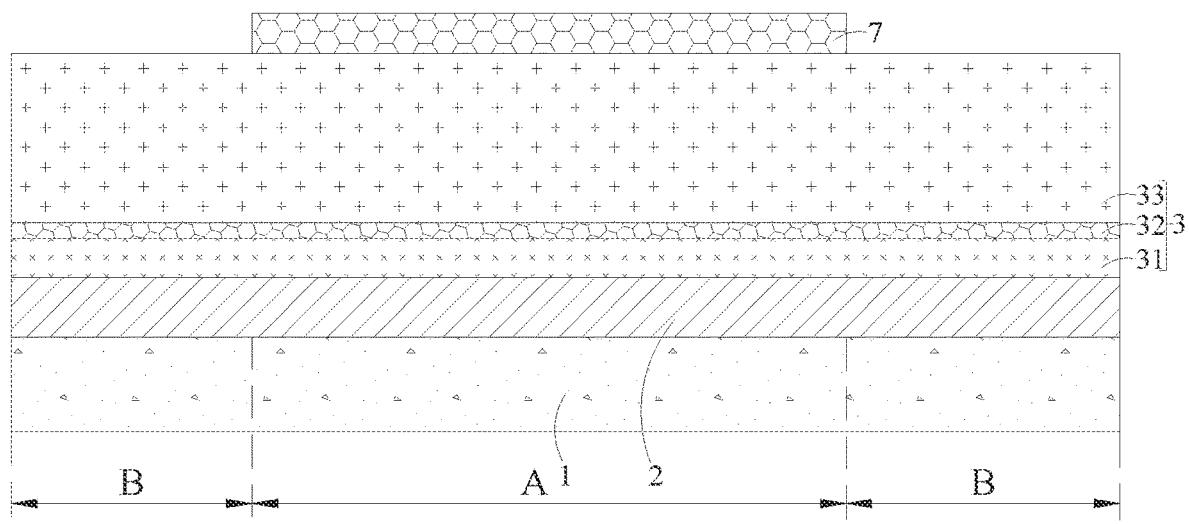
FIG. 5 is a schematic structural diagram after a protective layer is formed on the basis of FIG. 4.

In this exemplary embodiment, referring to FIG. 5, a protective material layer is formed on the isolation material layer group 3 by means of deposition, sputtering or evaporation, etc. The protective layer 7 is formed by etching the protective material layer with a mixed gas made up of $CHF_3$ and $O_2$. The protective layer 7 is formed only in the alignment region A, and no protective layer 7 is formed in the connection region B. That is, an orthographic projection of the protective layer 7 on the substrate 1 is only positioned within the alignment region A. A material of the protective layer 7 includes, for example, silicon oxide. A thickness of the protective layer 7 ranges, for example, between 0.4 μm and 0.6 μm. For example, the thickness of the protective layer 7 may be 0.4 μm, 0.5 μm, or 0.6 μm.

In Step S50, the isolation material layer group 3 and the protective layer 7 are etched, an etching rate of the protective layer 7 is less than an etching rate of the isolation material layer group 3 to remove the isolation material layer group 3 on the connection region B to form an isolation layer group 4, and an alignment groove 8 is formed on the isolation layer group 4 in the alignment region, where a depth of the alignment groove 8 is less than a thickness of the isolation layer group 4.

Figure 6:
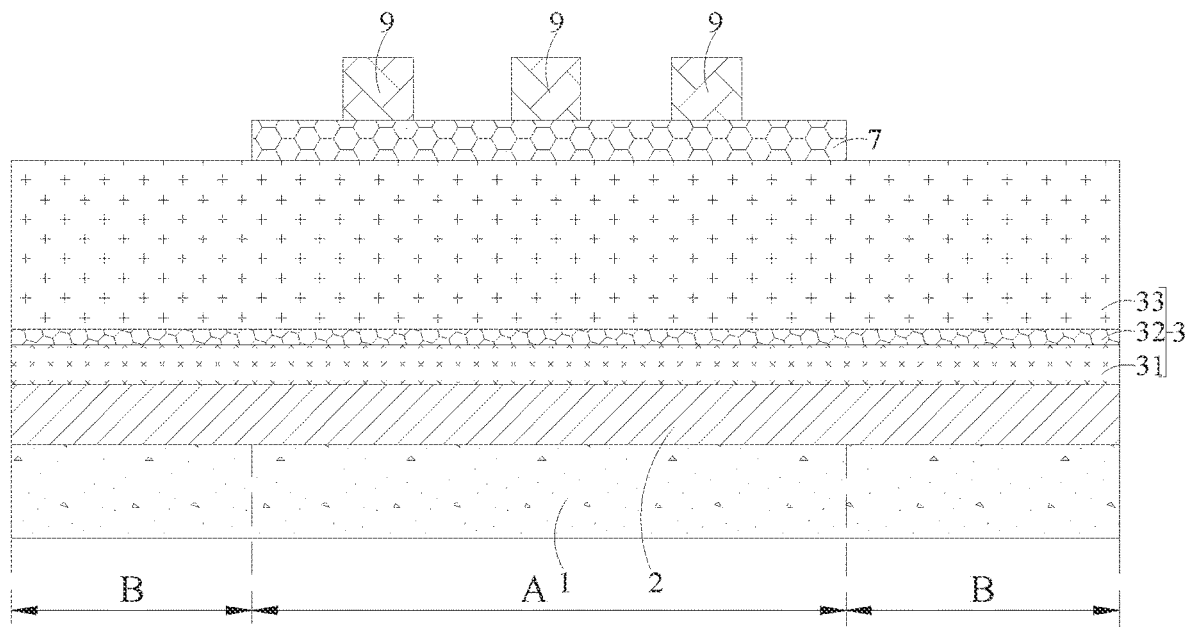
FIG. 6 is a schematic structural diagram after a preset pattern is formed on the basis of FIG. 5.

In this exemplary embodiment, referring to FIG. 6, a photoresist is coated and formed on the protective layer 7, and then exposure and development are performed on the photoresist, such that the photoresist forms a preset pattern 9, which is formed only in the alignment region A.

Referring to FIG. 6, in some embodiments, the material of the third isolation material layer 33 may also be amorphous carbon, and the material of the protective layer 7 may also be silicon oxide. A light absorbance of the protective layer 7 is smaller than that of the third isolation material layer 33, so the protective layer 7 has a lower degree of light absorption when the photoresist is formed on the protective layer 7. Therefore, the protective layer 7 can reduce the degree of light absorption, thereby improving accuracy of patterning. Furthermore, amorphous carbon is easier to etch than silicon oxide, which is beneficial to subsequent pattern transfer. As can be seen from FIG. 6, the thickness of the third isolation material layer 33 is greater than that of the protective layer 7, so the third isolation material layer 33 has a greater light absorbance when the photoresist is directly formed on the third isolation material layer 33, and the thickness of the third isolation material layer 33 is larger, thus the accuracy of patterning may be reduced.

Figure 7:
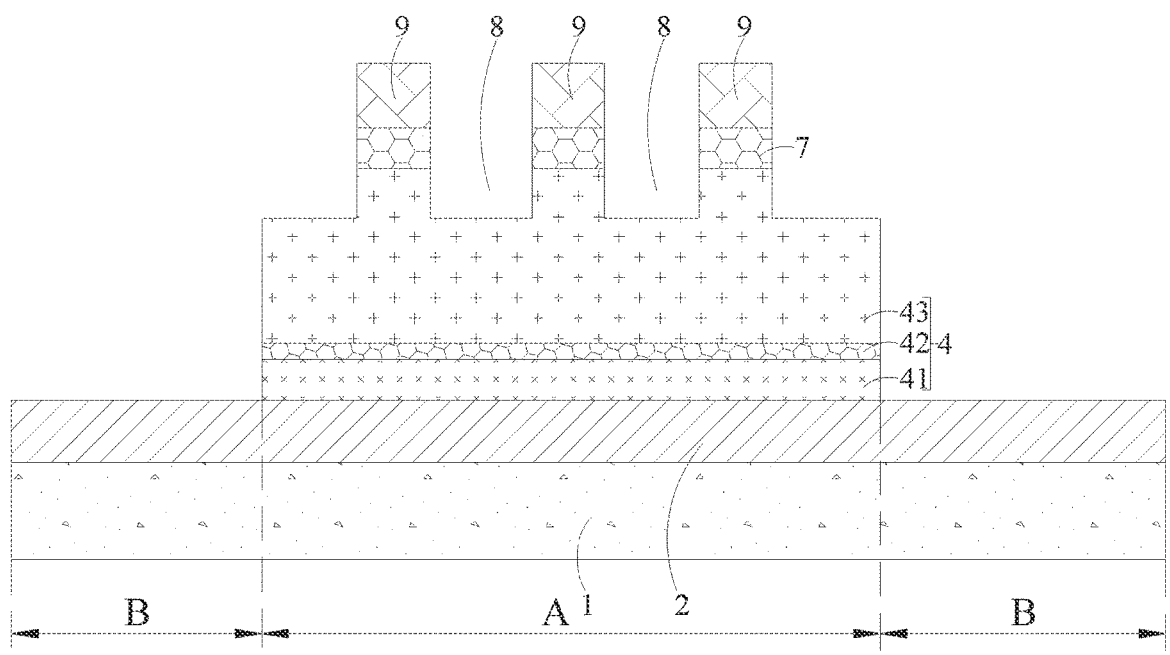
FIG. 7 is a schematic structural diagram after etching on the basis of FIG. 6.

Referring to FIG. 7, when etching the isolation material group 3 and the protective layer 7, neither the isolation material layer group nor the protective layer 7 positioned below the preset pattern 9 is etched due to the protection of the preset pattern 9. However, the isolation material layer group 3 and the protective layer 7 which are not protected by the preset pattern 9 may be etched.

However, because an etching rate of an etching gas to the protective layer 7 is smaller than that of the etching gas to the isolation material layer group 3, an etching depth of the isolation material layer group 3 in the alignment region A is smaller due to the protection of the protective layer 7. In contrast, after the same etching time, an etching depth of the isolation material layer group 3 in the connection region B is greater due to lack of the protection of the protective layer 7. Finally, after completion of the etching, the isolation material layer group 3 in the connection region B is completely etched away, such that the isolation material layer group 3 forms the isolation layer group 4, and the isolation layer group 4 forms bumps. In contrast, in the alignment region A, the isolation layer group 4 not protected by the preset pattern 9 is not completely etched away, instead only the alignment groove 8 is formed on the third isolation material layer 33. The depth of the alignment groove 8 not only is smaller than the thickness of the isolation layer group 4, but also is smaller than the thickness of the third isolation layer 43. The depth of the alignment groove 8 ranges, for example, between 0.4 μm and 0.6 μm. For example, the depth of the alignment groove 8 may be 0.4 μm, 0.5 μm or 0.6 μm.

Gases for etching the isolation material layer group 3 and the protective layer 7 may include $C_4F_6$ and $O_2$, and a proportion of $C_4F_6$ to $O_2$ may be (40-60):(20-40), for example, 50:30. A composition proportion of the etching gas may be adjusted, such that the isolation material layer group 3 and the protective layer 7 can be better etched.

In the same etching process, the protection of the protective layer 7 not only can form the isolation layer group 4 with a greater thickness, but also can form the alignment groove 8 with a smaller depth on the isolation layer group 4, such that one-step etching process is saved, production efficiency is improved, and production costs are reduced.

Figure 8:
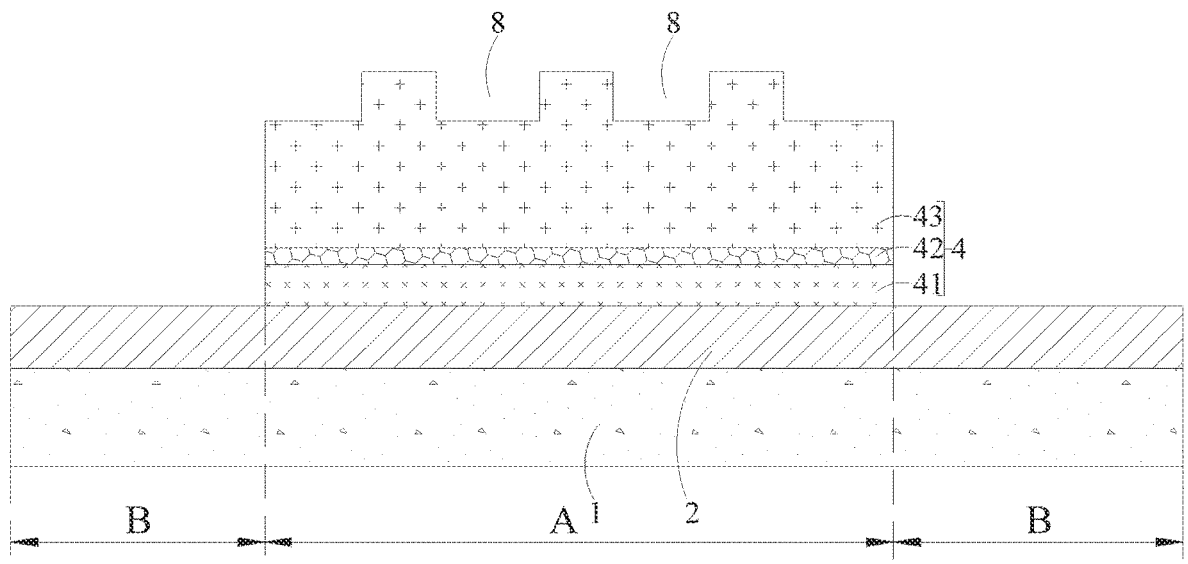
FIG. 8 is a schematic structural diagram after the preset pattern is removed on the basis of FIG. 7.

Next, referring to FIG. 8, the preset pattern 9 is removed, where a material of the preset pattern 9 is a photoresist, which may be removed by means of exposure and development. That is, the preset pattern 9 is exposed to light, and then the exposed preset pattern 9 is removed by means of a developer. Of course, in some other exemplary embodiments of the present disclosure, the preset pattern 9 may also be removed by means of an ashing process.

Finally, the protective layer 7 is removed, and the remaining protective layer 7 can be removed by means of a mixed etching gas comprising $CHF_3$, $O_2$, and $CF_4$.

It is to be noted that in some embodiments, when etching the isolation material layer group 3, the etching gas may also etch the preset pattern 9 and the protective layer 7. That is, the preset pattern 9 and the protective layer 7 can be removed simultaneously while the alignment groove 8 is formed, such that the etching steps can be reduced.

In Step S60, a second conductive layer group 10 is formed on the isolation layer group 4 and the first conductive layer 2, and the second conductive layer group 10 covers the alignment groove 8.

Figure 9:
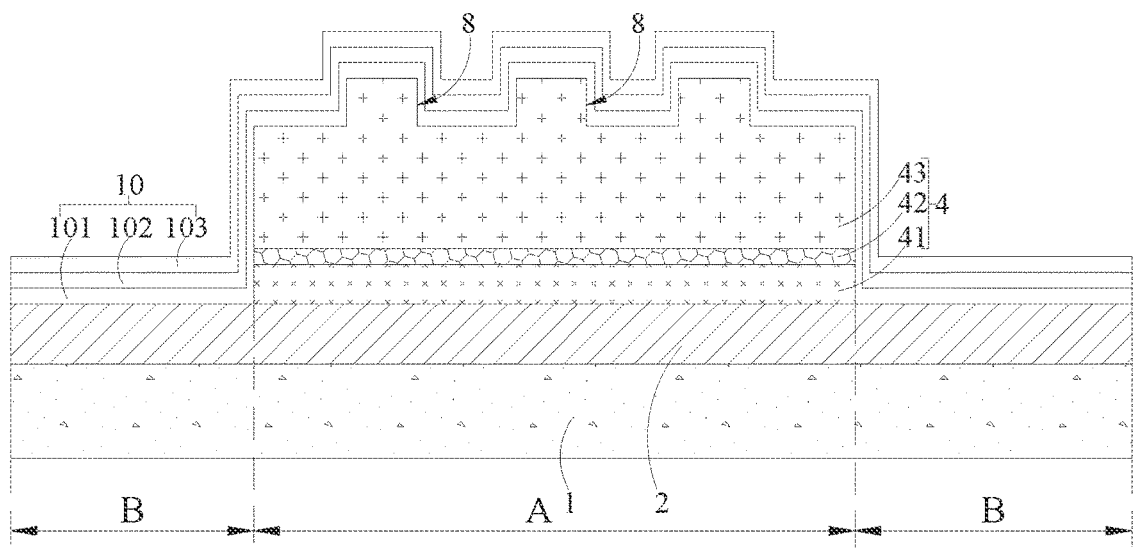
FIG. 9 is a schematic structural diagram after a second conductive layer is formed on the basis of FIG. 8.

In this exemplary embodiment, referring to FIG. 9, the second conductive layer group 10 is formed on the isolation layer group 4 and the exposed first conductive layer 2 by means of deposition, sputtering or evaporation, etc. The second conductive layer group 10 covers the alignment groove 8. An orthographic projection of the second conductive layer group 10 on the substrate 1 is positioned within the alignment region A and the connection region B. The second conductive layer group 10 in the connection region B is connected to the first conductive layer 2, whereby a connection between the first conductive layer 2 and an external circuit may be implemented. The second conductive layer group 10 can also be patterned, such that the second conductive layer group 10 forms a new connection circuit to achieve an objective of circuit redistribution. A material of the second conductive layer group 10 includes, for example, aluminum.

In some embodiments, a titanium metal layer 101 may be first formed on the isolation layer group and the first conductive layer by means of deposition, sputtering or evaporation, etc. A thickness of the titanium metal layer 101 ranges between 0.1 μm and 0.15 μm, and is 0.12 μm, for example. Next, an aluminum metal layer 102 is formed on the titanium metal layer 101 by means of deposition, sputtering or evaporation, etc. A thickness of the aluminum metal layer 102 ranges, for example, between 4.2 μm and 4.7 μm. For example, the thickness of the aluminum metal layer 102 may be 4.2 μm, 4.5 μm, or 4.7 μm. Next, a titanium nitride layer 103 is formed on the aluminum metal layer 102 by means of deposition, sputtering or evaporation, etc. A thickness of the titanium nitride layer 103 ranges, for example, between 0.04 μm and 0.06 μm. For example, the thickness of the titanium nitride layer 103 may be 0.05 μm. The titanium metal layer 101, the aluminum metal layer 102 and the titanium nitride layer 103 form the second conductive layer group 10.

As a wiring redistribution layer, the aluminum metal layer 102 is not easily formed on the third isolation material layer 33, such that an open circuit is easily generated in the aluminum metal layer 102. The titanium metal layer 101 is arranged between the aluminum metal layer 102 and the third isolation material layer 33. In one aspect, the aluminum metal layer 102 is easily arranged on the titanium metal layer 101. That is, the titanium metal layer 101 can improve cohesiveness of the deposition of the aluminum metal layer 102, thereby reducing occurrence of the open circuit caused by insufficient deposition of the aluminum metal layer 102. In another aspect, even though the aluminum metal layer 102 has a position of the open circuit, the position of the open circuit of the aluminum metal layer 102 can be connected through the titanium metal layer 101, thereby further avoiding the occurrence of the open circuit of the aluminum metal layer 102 and improving product yield.

In addition, the aluminum metal layer 102 is thicker, and thus larger stress may be caused. Furthermore, the aluminum metal layer 102 is prone to warping, which adversely affects conductive effects. Because titanium nitride has a larger density, after the titanium nitride layer 103 is arranged on the aluminum metal layer 102, a warping degree of the aluminum metal layer 102 may be improved by gravity of titanium nitride, thus improving the conductive effects.

Moreover, the second conductive layer group 10 having a three-layer structure has a lower impedance, which may further improve the conductive effects.

It is to be noted that because the alignment groove 8 has a smaller depth-to-width ratio, when the second conductive layer group 10 is formed on the alignment groove 8, the depth-to-width ratio of the alignment groove 8 may be further reduced because part of the second conductive layer 10 is positioned in the alignment groove 8, such that the alignment accuracy can be further improved when the lithography machine is aligning.

Of course, in other exemplary embodiments of the present disclosure, the material of the second conductive layer group 10 may also include copper, and Ni—Au or Ni—Pd—Au may be plated on copper tracks as required. A thicker copper structure has the advantages of lower resistance, higher heat dissipation and lower costs, which makes it a better choice for high-current and high-power devices.

The second conductive layer group 10 also can increase spacing between interfaces, provide a larger bump (the isolation layer group 4) area, reduce the stress between the substrate and an element, increase reliability of the element, replace part of circuit design, and accelerate development time for an Integrated Circuit Chip (IC chip).

It is to be noted that steps of the method for fabricating the semiconductor structure in the present disclosure are described in a particular order in the accompanying drawings. However, this does not require or imply to execute these steps necessarily according to the particular order, or this does not mean that the expected result cannot be implemented unless all the shown steps are executed. Additionally, some steps may be omitted, a plurality of steps may be combined into one step for execution, and/or one step may be decomposed into a plurality of steps for execution.

Based on the same inventive concept, an exemplary embodiment of the present disclosure also provides a semiconductor device, which is fabricated by the above fabrication method. Referring to FIG. 9, the semiconductor device may include a substrate 1, a first conductive layer 2, an isolation layer group 4, and a second conductive layer group 10. The substrate 1 may include an alignment region A and a connection region B. The first conductive layer 2 is arranged on the substrate 1, the isolation layer group 4 is arranged on the first conductive layer 2 and is positioned on the alignment region A, and an alignment groove 8 is arranged on the isolation layer group 4, where the depth of the alignment groove 8 is smaller than the thickness of the isolation layer group 4. The second conductive layer group 10 is arranged on the isolation layer group 4 and the first conductive layer 2, and the second conductive layer group 10 covers the alignment groove 8.

In this exemplary embodiment, the substrate 1 may be a semiconductor element that has been fabricated, and the semiconductor element may be a Metal-Oxide-Semiconductor Field-Effect Transistor (MOSFET), which is abbreviated as a MOS transistor. The MOS transistor may be a Positive Channel Metal Oxide Semiconductor (PMOS) or a Negative Channel Metal Oxide Semiconductor (NMOS) transistor, and the MOS transistor may include a storage capacitor, a bit line, a word line, a gate, a source and a drain, etc.

Referring to FIG. 2, the substrate 1 may include the alignment region A and the connection region B. In some embodiments, two connection regions B may be provided, and the two connection regions B are positioned on two sides of the alignment region A.

Of course, in other exemplary embodiments of the present disclosure, a plurality of connection regions B may also be provided, and concrete positions of the plurality of connection regions B may be set as required; and a plurality of alignment regions A may also be provided, and concrete positions of the plurality of alignment regions A may also be set as required.

In this exemplary embodiment, the first conductive layer 2 not only is formed in the alignment region A, but also is formed in the connection region B. The first conductive layer 2 may be connected to a gate, a source or a drain in the substrate 1, and signals can be inputted to the gate, the source or the drain in the substrate 1 through the first conductive layer 2, or the signals stored in the substrate 1 can be outputted through the first conductive layer 2. A material of the first conductive layer 2 is, for example, aluminum. The thickness of the first conductive layer 2 ranges, for example, between 0.6 µm and 1.0 µm. For example, the thickness of the first conductive layer 2 may be 0.8 µm. The material of the first conductive layer 2 may be metal such as copper or silver.

In this exemplary embodiment, the isolation layer group 4 may include a first isolation layer 41, a second isolation layer 42, and a third isolation layer 43. The first isolation layer 41 is arranged on the first conductive layer 2, the second isolation layer 42 is arranged on the first isolation layer 41, and the third isolation layer 43 is arranged on the second isolation layer 42, where the thickness of the third isolation layer 43 is greater than that of the first isolation layer 41.

The material of the first isolation layer 41 includes, for example, silicon oxide. The thickness of the first isolation layer 41 ranges, for example, between 0.6 µm and 1.0 µm. For example, the thickness of the first isolation layer 41 may be 0.8 µm.

The material of the second isolation layer 42 includes, for example, silicon nitride. The thickness of the second isolation layer 42 ranges, for example, between 0.5 µm and 0.7 µm. For example, the thickness of the second isolation layer 42 may be 0.6 µm.

The material of the third isolation layer 43 includes, for example, silicon oxide. The thickness of the third isolation layer 43 ranges, for example, between 4.0 µm and 5.0 µm. For example, the thickness of the third isolation layer 43 may be 4.5 µm.

The isolation layer group 4 is formed only in the alignment region A. That is, an orthographic projection of the isolation layer group 4 on the substrate 1 is positioned only within the alignment region A.

The substrate 1 and the first conductive layer 2 may be protected by the isolation material layer group 4. Moreover, the thickness of the third isolation layer 43 is larger, which can play a role of planarization, provide a better substrate for the second conductive layer group 10 formed subsequently, and facilitate forming the second conductive layer group 10 having a more uniform thickness, and thus it is advantageous to improving uniformity of conductivity of the semiconductor device. Furthermore, the larger thickness of the third isolation layer 43 can prevent etching to the second isolation layer 42 when the alignment groove 8 is formed, can protect the second isolation layer 42 and prevent the alignment groove 8 from exposing the second isolation layer 42, to improve performance of the semiconductor device.

In this exemplary embodiment, the alignment groove 8 is provided on the third isolation layer 43, but is not provided on the second isolation layer 42 and the first isolation layer 41, and the depth of the alignment groove 8 is less than the thickness of the third isolation layer 43. Therefore, the depth of the alignment groove 8 is smaller, and the depth-width ratio is smaller. When the lithography machine is aligning, laser light emitted by the lithography machine has less number of reflections in the alignment groove 8 after hitting the alignment groove 8, which may reduce errors of the laser light, thereby improving alignment accuracy of the laser light, enabling the lithography machine to align well through the alignment groove 8, and thus solving a problem of alignment failure of the lithography machine. Moreover, the inclined structure is not easily formed on the bottom of the alignment groove 8 with a smaller depth, which is also beneficial for the lithography machine to align and expose through the alignment groove 8. The depth of the alignment groove 8 is greater than or equal to 0.4 µm and is less than or equal to 0.6 µm. For example, the depth of the alignment groove 8 may be 0.5 µm.

In this exemplary embodiment, two alignment grooves 8 are provided. An isolation wall is provided between the adjacent two alignment grooves 8, and an outermost side of the alignment groove 8 is also provided with the isolation wall. Of course, a plurality of alignment grooves 8 may be provided as required, and the plurality of alignment grooves 8 may be arranged in parallel or arranged crosswise to form a desired alignment pattern.

In this exemplary embodiment, the second conductive layer group 10 is arranged on the isolation layer group 4 and the first conductive layer 2, and the second conductive layer group 10 covers the alignment groove 8, that is, the orthographic projection of the second conductive layer group 10 on the substrate 1 is positioned within the alignment region A and the connection region B. The second conductive layer group 10 in the connection region B is connected to the first conductive layer 2. The second conductive layer group 10 can also be patterned, such that the second conductive layer group 10 forms a new connection circuit to achieve the objective of circuit redistribution.

In some embodiments, the second conductive layer group 10 may include a titanium metal layer 101, an aluminum metal layer 102, and a titanium nitride layer 103. The titanium metal layer 101 is arranged on the isolation layer group and the first conductive layer, the aluminum metal layer 102 is arranged on the titanium metal layer 101, and the titanium nitride layer 103 is arranged on the aluminum metal layer 102. The thickness of the titanium metal layer 101 is, for example, 0.1 μm. The thickness of the aluminum metal layer 102 ranges, for example, between 4.2 μm and 4.7 μm. For example, the thickness of the aluminum metal layer 102 may be 4.5 μm. The thickness of the titanium nitride layer 103 ranges, for example, between 0.04 μm and 0.06 μm. For example, the thickness of the titanium nitride layer 103 may be 0.05 μm. The titanium metal layer 101, the aluminum metal layer 102 and the titanium nitride layer 103 form the second conductive layer group 10.

As a wiring redistribution layer, the aluminum metal layer 102 is not easily formed on the third isolation material layer 33, such that an open circuit is easily generated in the aluminum metal layer 102. The titanium metal layer 101 is arranged between the aluminum metal layer 102 and the third isolation material layer 33. In one aspect, the aluminum metal layer 102 is easily arranged on the titanium metal layer 101. That is, the titanium metal layer 101 can improve cohesiveness of the deposition of the aluminum metal layer 102, thereby reducing occurrence of the open circuit caused by insufficient deposition of the aluminum metal layer 102. In another aspect, even though the aluminum metal layer 102 has a position of the open circuit, the position of the open circuit of the aluminum metal layer 102 can be connected through the titanium metal layer 101, thereby further avoiding the occurrence of the open circuit of the aluminum metal layer 102 and improving product yield.

In addition, the aluminum metal layer 102 is thicker, and thus larger stress may be caused. Furthermore, the aluminum metal layer 102 is prone to warping, which adversely affects conductive effects. Because titanium nitride has a larger density, after the titanium nitride layer 103 is arranged on the aluminum metal layer 102, a warping degree of the aluminum metal layer 102 may be improved by gravity of titanium nitride, thus improving the conductive effects.

Moreover, the second conductive layer group 10 having a three-layer structure has a lower impedance, which may further improve the conductive effects.

Of course, in other exemplary embodiments of the present disclosure, the material of the second conductive layer group 10 may also include copper, and Ni—Au or Ni—Pd—Au may be plated on copper tracks as required. The thicker copper structure has the advantages of lower resistance, higher heat dissipation and lower costs, which makes it a better choice for high-current and high-power devices.

Other embodiments of the present disclosure will be apparent to those skilled in the art from consideration of the specification and practice of the present disclosure disclosed here. The present disclosure is intended to cover any variations, uses, or adaptations of the present disclosure following the general principles thereof and including such departures from the present disclosure as come within known or customary practice in the art. It is intended that the specification and embodiments be considered as exemplary only, with a true scope and spirit of the present disclosure being indicated by the appended claims.

What is claimed is:

1. A method for fabricating a semiconductor device, comprising:
   providing a substrate comprising an alignment region and a connection region;
   forming a first conductive layer on the substrate;
   forming an isolation material layer group on the first conductive layer;
   forming a protective layer on the isolation material layer group, the protective layer being positioned on the alignment region;
   etching the isolation material layer group and the protective layer, an etching rate of the protective layer being less than an etching rate of the isolation material layer group to remove the isolation material layer group on the connection region to form an isolation layer group, and forming an alignment groove on the isolation layer group in the alignment region, a depth of the alignment groove being less than a thickness of the isolation layer group; and
   forming a second conductive layer group on the isolation layer group and the first conductive layer, the second conductive layer group covering the alignment groove;
   wherein the forming the isolation material layer group on the first conductive layer comprises:
   forming a first isolation material layer on the first conductive layer;
   forming a second isolation material layer on the first isolation material layer; and
   forming a third isolation material layer on the second isolation material layer, a thickness of the third isolation material layer being greater than a thickness of the first isolation material layer;
   wherein a depth of the alignment groove is less than a thickness of the third isolation material layer.

2. The method for fabricating the semiconductor device according to claim 1, wherein gases for etching the isolation layer group and the protective layer comprise $C_4F_6$ and $O_2$.

3. The method for fabricating the semiconductor device according to claim 1, wherein the forming the alignment groove comprises:
   removing the protective layer and a part of the third isolation material layer to form the alignment groove on the third isolation material layer.

4. The method for fabricating the semiconductor device according to claim 1 further comprising removing the protective layer before forming the second conductive layer group.

5. The method for fabricating the semiconductor device according to claim 1, wherein the forming the second conductive layer group comprises forming a plurality of conductive layers.

6. The method for fabricating the semiconductor device according to claim 5, wherein the forming the second conductive layer group on the isolation layer group and the first conductive layer comprises:
   forming a titanium metal layer on the isolation layer group and the first conductive layer;
   forming an aluminum metal layer on the titanium metal layer; and
   forming a titanium nitride layer on the aluminum metal layer.

7. The method for fabricating the semiconductor device according to claim 1, wherein the connection region is positioned on two sides of the alignment region.

8. A semiconductor device comprising:
   a substrate comprising an alignment region and a connection region;
   a first conductive layer arranged on the substrate;
   an isolation layer group arranged on the first conductive layer and positioned on the alignment region, wherein the isolation layer group is provided with an alignment groove, and a depth of the alignment groove is less than a thickness of the isolation layer group; and a second conductive layer group arranged on the isolation layer group and the first conductive layer, wherein the second conductive layer group covers the alignment groove;

wherein the isolation layer group comprises:

a first isolation layer arranged on the first conductive layer;

a second isolation layer arranged on the first isolation layer; and a third isolation layer arranged on the second isolation layer, wherein a thickness of the third isolation layer is greater than a thickness of the first isolation layer;

wherein a depth of the alignment groove is less than a thickness of the third isolation layer.

9. The semiconductor device according to claim 8, wherein the depth of the alignment groove ranges between 0.4 µm and 0.6 µm.

10. The semiconductor device according to claim 8, wherein the second conductive layer group comprises a plurality of conductive layers.

11. The semiconductor device according to claim 10, wherein the second conductive layer group comprises:

a titanium metal layer arranged on the isolation layer group and the first conductive layer;

an aluminum metal layer arranged on the titanium metal layer; and a titanium nitride layer arranged on the aluminum metal layer.

12. The semiconductor device according to claim 11, wherein a thickness of the titanium metal layer ranges between 0.1 µm and 0.15 µm, a thickness of the aluminum metal layer ranges between 4.2 µm and 4.7 µm, and a thickness of the titanium nitride layer ranges between 0.04 µm and 0.06 µm.

13. A semiconductor device comprising:

a substrate comprising an alignment region and a connection region;

a first conductive layer arranged on the substrate;

an isolation layer group arranged on the first conductive layer and positioned on the alignment region, wherein the isolation layer group is provided with an alignment groove, and a depth of the alignment groove is less than a thickness of the isolation layer group; and a second conductive layer group arranged on the isolation layer group and the first conductive layer, wherein the second conductive layer group covers the alignment groove;

wherein the second conductive layer group comprises:

a titanium metal layer arranged on the isolation layer group and the first conductive layer;

an aluminum metal layer arranged on the titanium metal layer; and a titanium nitride layer arranged on the aluminum metal layer.

14. The semiconductor device according to claim 11, wherein a thickness of the titanium metal layer ranges between 0.1 µm and 0.15 µm, a thickness of the aluminum metal layer ranges between 4.2 µm and 4.7 µm, and a thickness of the titanium nitride layer ranges between 0.04 µm and 0.06 µm.

\* \* \* \* \*